United States Patent
Wu et al.

(10) Patent No.: US 6,329,299 B1
(45) Date of Patent: Dec. 11, 2001

(54) COMPOSITIONS AND METHODS FOR THE SELECTIVE ETCHING OF TANTALUM-CONTAINING FILMS FOR WAFER RECLAMATION

(75) Inventors: Biao Wu, Chanhassen, MN (US); Boyd J. Wiedenman, Fremont, CA (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/470,153

(22) Filed: Dec. 22, 1999

(51) Int. Cl.$^7$ .................................................. H01L 21/302
(52) U.S. Cl. .................................... 438/745; 438/754
(58) Field of Search ........................... 438/745, 747, 438/749, 751, 754; 430/313, 314, 315

(56) References Cited

U.S. PATENT DOCUMENTS

| | | | |
|---|---|---|---|
| 4,446,115 | * 5/1984 | Endo et al. | 423/63 |
| 5,795,458 | * 8/1998 | Miyoshi | 205/124 |

FOREIGN PATENT DOCUMENTS

414330 * 6/1974 (SU) .

* cited by examiner

*Primary Examiner*—Benjamin L. Utech
*Assistant Examiner*—Kin-Chan Chen
(74) *Attorney, Agent, or Firm*—Kagan Binder, PLLC

(57) ABSTRACT

The present invention provides methods for selectively stripping tantalum-containing films from oxide surfaces using an etching composition including a fluoride ion source and an acidic oxidant. The etching composition exhibits a high degree of selectivity between tantalum-containing films and oxide films, such that the underlying oxide surface or film layer acts as a stop layer, thereby protecting the underlying substrate from the etching composition. Furthermore, the etching composition is effective at substantially at ambient temperature, thereby avoiding the potential safety concerns that may arise when chemicals are heated in manufacturing situations. Finally, in certain preferred embodiments, the etching composition may further comprise a non-acidic oxidant. In these embodiments of the invention the etching composition is useful to reclaim wafers having at least a portion of the wafer substrate exposed, eg., wafers bearing film stacks comprising TEOS.

5 Claims, 2 Drawing Sheets

COMPOSITIONS AND METHODS FOR THE SELECTIVE ETCHING OF TANTALUM-CONTAINING FILMS FOR WAFER RECLAMATION

FIELD OF THE INVENTION

This invention relates to methods and compositions for selectively removing a tantalum-containing film from an oxide surface by using, an aqueous, acidic etching composition comprising a relatively small amount of a fluoride ion source and a relatively large amount of an acidic oxidant. Because the composition exhibits a high degree of selectivity between tantalum-containing films and oxide films, the composition and methods are particularly useful in wafer reclamation processes.

BACKGROUND OF THE INVENTION

Wafer reclamation is becoming more important to integrated circuit manufacturers as the cost of test wafers continues to rise. Wafer reclamation is a process in which layers of films, or "film stacks", on semiconductor wafer substrates are removed so that the wafer can be reused. Of course, in order for wafer reclamation to be practically and economically feasible, the method of removing the film stacks must not only be capable of removing substantially all of the film layers, but must be capable of doing so at a cost less than that of replacing the wafer. Furthermore, the process must not substantially damage the surface of the wafer. Finally, the process of removing the film stacks desirably proceeds at a reasonable rate so that the utilization of the reclamation process is practical in a typical manufacturing setting.

While many kinds of films, such as oxide films, nitride films, and metal films, are relatively easy to selectively remove using conventional reclamation chemicals and techniques, the selective removal of other films, such as tantalum-containing films, can be difficult. In particular, different tantalum-containing films can require different reclamation chemicals to remove them. That is, reclamation chemicals useful to remove one type of tantalum-containing film are not necessarily useful to remove other types of tantalum-containing, films. For example, only one reclamation chemical, concentrated hydrofluoric acid, previously has been identified that is effective to remove tantalum films. However, concentrated hydrofluoric acid will not remove other tantalum-containing films, e.g., tantalum nitride films, and in fact, a mixture of ammonium hydroxide and hydrogen peroxide (ammonium peroxide mixture or APM) is the only currently identified effective reclamation chemical for tantalum nitride films. This presents a processing difficulty in that wafers comprising these different tantalum-containing films must be separated from each other before being subjected to the appropriate reclamation process. Such separation can be time consuming to carry out, and in the least represents the addition of a step that may undesirably lengthen the reclamation process.

Additionally, not only can various tantalum-containing films require the use of different reclamation chemicals to remove them effectively, but the different film layers typically present in film stacks comprising tantalum-containing films can also require the use of several different reclamation chemicals to effectively reclaim a wafer comprising such a film stack. That is, tantalum-containing films are typically used in film stacks comprising copper (Cu) overlying the tantalum-containing film, which, in turn, overlies a silicon oxide ($SiO_2$) film, such as thermal oxide (TOX) or tetraethyl orthosilicate (TEOS), e.g., Cu/Ta or TaN/TEOS or TOX film stacks. Each of these individual films typically requires the use of a different reclamation chemical in order to remove the film effectively. This not only has the effect of rendering the reclamation process of wafers comprising such film stacks time consuming in that the process must incorporate the time necessary to change chemicals, but also can render the reclamation process more expensive than a corresponding reclamation process requiring fewer chemicals.

For example, one process currently employed for the removal of a copper/tantalum/TEOS film stack comprises the application of a hydrochloric acid and hydrogen peroxide mixture (HPM), followed by the application of concentrated hydrofluoric acid (HF). In this process, the HPM acts to remove substantially all of the copper, while the concentrated HF is effective to remove both the tantalum and the TEOS. Although extremely effective for these particular film stacks, this process has some concurrent effects that can be undesirable in some applications. For example, concentrated HF etches oxide rapidly, and thus, may increase the surface roughness of the wafer if applied for too lengthy a period of time. Additionally, concentrated HF may not be compatible with materials desirably used to fabricate some kinds of reclamation process equipment. For example, contact with concentrated HF may result in the undesirable discoloration of components of reclamation equipment fabricated from polyvinylidene fluoride (PVDF), perfluoroalkoxy (PFA) or polytetrafluoroethylene (PTFE).

An additional conventional reclamation process, effective to remove copper/tantalum nitride/TEOS or TOX film stacks, involves the application of HPM followed by the application of APM followed by the application of dilute HF. In this process, the HPM again functions to remove substantially all of the copper layer, while the APM acts to remove the tantalum nitride (TaN) and the dilute hydrofluoric acid removes the TEOS layer. This process is less than ideal in that the use of three chemicals is required in order to effectively remove the entire film stack. Additionally, in order to achieve an etch rate of tantalum nitride that is practical for use in a reclamation process, the APM typically must be heated. Heating the APM necessitates the inclusion of a heater in the reclamation processing system, which may present additional cost and space issues. Additionally, relatively hot processing in a manufacturing setting is generally considered to be less desirable than ambient processes in that the handling of heated chemicals is more challenging than is handling the same or different chemicals at ambient temperature.

An additional complication in the reclamation of wafers bearing film stacks comprising tantalum-containing films is presented by the inclusion of TIOS as the oxide layer in such film stacks. That is, although many oxide film layers are typically applied to wafers by subjecting the wafers to high heat, which results in the oxide film layer forming on both the top and bottom surface of the wafers, TEOS films are not formed or applied in this manner. Rather, TEOS films are applied by chemical vapor deposition, which results in the film being formed only on the top surface of the wafer. Thus, whereas wafers bearing film stacks on their top surface comprising other oxide films typically have at least some amount of oxide on their bottom surface that thereby acts to protect this bottom surface from the reclamation chemicals that may otherwise damage the bare silicon wafer, wafers bearing film stacks comprising TEOS as an oxide layer do not have such a protective oxide film on their bottom surface. As a result, the exposed bottom surface of such wafers can be damaged by the application of certain reclamation chemicals, and in particular, can be damaged by the application of reclamation chemicals comprising a fluoride ion source.

Aqueous compositions including nitric acid ($HNO_3$), hydrofluoric acid (HF), and water ($H_2O$) have been used in the past in the manufacture of integrated circuits, particularly for silicon etching processes. Conventionally, these compositions have included from about 50% to about 60% by volume of aqueous $HNO_3$ (typically about 70 weight % solids), 10% or more aqueous HF (typically about 50 weight % solids), with the remainder being $H_2O$. See, for example, "Silicon Processing for the VLSI era—Volume 1, process technology", by S. Wolf and R. N. Tauber, Lattice Press, Sunset Beach, Calif., page 531–532, 1986. However, and although these compositions have not been studied for use in etching applications where it is desired to remove tantalum-containing films, because of the extremely fast etch rates these compositions exhibit with oxide films, it is expected that these compositions will etch oxide films much faster than tantalum-containing films. In other words, these compositions are expected to exhibit selectivity that favors oxide, not tantalum-containing films. In reclamation processes, where an oxide layer desirably acts as a "stop layer", this lack of stripping selectivity between tantalum-containing films and oxide films would be undesirable. These compositions would most likely etch through the oxide before all the tantalum is removed, thereby damaging the underlying wafer. Additionally, the use of such compositions to reclaim wafers bearing a film stack comprising TEOS can result in damage to the bottom, unprotected surface of the wafer due to the presence of a relatively high amount of concentrated hydrofluoric acid. As a result, these aqueous $HF/HNO_3$ compositions are not considered to be useful for reclamation applications, and in particular, in reclamation processes desirably utilized to reclaim wafers bearing tantalum-containing film stacks.

What is needed, therefore, are reclamation compositions and methods that provide the desired stripping selectivity between tantalum-containing films and oxide films, i.e., in which the etching selectivity favors tantalum-containing films so that the oxide layer can act as a stop layer to protect the wafer as the tantalum-containing film is removed. Such compositions and processes desirably would be useful for film stacks comprising any type of tantalum-containing films, and further would be suitable for use with film stacks comprising any oxide film, including TEOS, without causing substantial damage to the bottom surface of the wafer. It would further be desirable for such compositions to be compatible with materials such as PVDF that may be used in the manufacture of reclamation process equipment. Finally, it would be advantageous if such reclamation compositions and processes would be effective at substantially ambient temperatures so that the cost and safety concerns that are sometimes associated with hot chemical processes could be avoided.

SUMMARY OF THE INVENTION

According to the present invention, the above objectives and other objectives apparent to those skilled in the art upon reading this disclosure are attained by the present invention which is drawn to methods for use in wafer reclamation that utilize an etching composition which comprises a fluoride ion source and an oxidant. Specifically, the etching composition preferably is acidic and comprises a relatively large amount of an acidic oxidant and a relatively small amount of the fluoride ion source so that the composition shows favorable selectivity for etching tantalum-containing films relative to oxide films. Due to this selectivity, the etching composition of the present invention can remove a tantalum-containing film from an oxide surface while leaving an underlying substrate, such as a semiconductor wafer, substantially undamaged. Moreover, in certain preferred embodiments, the etching compositions may optionally further comprise an amount of a non-acidic oxidant effective to oxidize, or passivate, the bottom surface of a wafer so that wafers bearing films stacks comprising TEOS, the back surface of which would otherwise be unprotected, may effectively be reclaimed utilizing the etching compositions of the present invention. Additionally, etching compositions in accordance with the present invention can remove tantalum and tantalum nitride films, and thus wafers comprising such film stacks need not be separated prior to being subjected to a reclamation process utilizing the inventive etching compositions. Finally, due to the unique composition of the etching composition, it is capable of providing such high etch rates at substantially ambient temperature, and without substantially damaging manufacturing equipment comprising many plastic materials, including PVDF.

Due to the selectivity of the etching composition, and furthermore due to the extremely high etch rates that can be achieved, the etching composition of the present invention finds particular utility in the reclamation of semiconductor wafers. Thus, in one aspect, the present invention provides a method of reclaiming a semiconductor wafer substrate bearing a film stack comprising a tantalum-containing film overlying an oxide film. Specifically, the method comprises the steps of causing an etching composition in accordance with the present invention to contact the tantalum-containing film under conditions effective to remove at least a portion of the tantalum-containing film from the substrate thereby exposing the oxide film. The exposed oxide film is then removed from the substrate using any desired chemistry, and the wafer is thus reclaimed.

In another aspect of the present invention, there is provided an aqueous etching composition suitable for use in the reclamation of wafers bearing a film stack comprising a tantalum-containing film. In particular, the etching composition comprises an acidic oxidant and a fluoride ion source. Preferably, the volume ratio of the acidic oxidant to the fluoride ion source is sufficiently high such that the etching composition has a tantalum-containing material/oxide stripping selectivity of at least about 2 or more. The etching composition desirably has an acidic pH. In preferred embodiments, the acidic oxidant is nitric acid and the fluoride ion source is hydrofluoric acid, with the ratio of $HNO_3$ to HF being high enough so that the composition etches tantalum-containing films relative to oxide films with favorable selectivity. This is an unexpected and surprising result inasmuch as conventional $HNO_3/HF$ compositions exhibit the opposite selectivity, i.e., favoring oxide over tantalum-containing materials. Additionally, in certain preferred embodiments, the etching composition further comprises a non-acidic oxidant. Advantageously, this non-acidic oxidant acts to oxidize any exposed surface of the silicon wafer, thereby protecting such an exposed surface from the action of the etching composition.

As a result of the inclusion of the non-acidic oxidant, etching compositions in accordance with this preferred embodiment of the present invention can be used to reclaim wafers having an exposed surface, such as a back or bottom surface, as is the case with wafers bearing a film stack comprising a TEOS film. That is, it has now been discovered that the use of a non-acidic oxidant in a process to reclaim wafers which have a bottom surface that is typically substantially unprotected and exposed, can act to protect the bottom surface by forming a protective layer on the otherwise exposed surface, e.g., as by oxidation. Such a non-acidic oxidant advantageously can be provided in combination with the etching composition being used, may be applied separately as a pre-treatment step, or alternatively, may be applied intermittently with the etching composition.

Thus, and in yet another aspect of the invention, there is provided a method of reclaiming a semiconductor wafer substrate bearing a film stack comprising a tantalum-containing film overlying an oxide film and wherein at least a portion of the semiconductor wafer substrate is exposed. Specifically, the method comprises the steps of (a) causing a first non-acidic oxidant to contact the semiconductor wafer under conditions effective to oxidize at least a portion of the exposed surface, thereby forming a protective, oxidized layer on the exposed surface. An etching composition in accordance with the present invention is then (b) caused to contact the tantalum-containing film under conditions effective to remove at least a portion of the tantalum-containing film from the semiconductor wafer substrate. The etching composition may optionally comprise an amount of a second non-acidic oxidant, that may either be the same as the first non-acidic oxidant or different. Alternatively, the second non-acidic oxidant may be applied intermittently with the etching composition, i.e., steps (a) and (b) may be repeated until substantially all of the tantalum-containing film has been removed, thereby exposing the underlying oxide film. The exposed oxide film is then removed from the semiconductor wafer substrate utilizing any known chemistry.

As used herein, the phrase "tantalum-containing material/oxide stripping selectivity" means the ratio of the etch rate of a tantalum-containing film to the etch rate of an oxide film as achieved by an etching composition and can be represented by the mathematical formula $E_t/E_o$, where $E_t$ is the rate in Å/m per minute at which the composition etches a tantalum-containing film at 22° C., and $E_o$ is the rate, in Å/min at which the same composition etches an oxide film at 22° C. Etch rate can be determined by, for example, by measuring the film thickness before and after etching, and then calculating etch rate according to the following formula: $ER=(T_{pre}-T_{post})/t$ where ER is etch rate, $T_{pre}$ is the film thickness in angstroms prior to etching, $T_{post}$ is the film thickness in angstroms after etching and t is the duration of etching in minutes. Desirably, the film thickness measurements are made utilizing an ellipsometer at either 9 points or 25 points across the wafer surface. If the stripping selectivity as calculated is >1, the composition is considered to favor tantalum-containing films relative to oxide films. If the stripping selectivity as calculated is <1, the composition is considered to favor oxide films relative to tantalum-containing films. For reclamation processes, it would be desirable for the selectivity to be substantially >1, e.g., at least about or more preferably 10 or more, more preferably 10 to 1000, most preferably about 50 so that the oxide layer can act as a stop layer to protect the water as the tantalum-containing film is removed.

Unless otherwise indicated, as used herein, all references to percentages are percentages by volume of the etching composition.

BRIEF DESCRIPTION OF THE FIGURES

The above mentioned and other advantages of the present invention, and the manner of attaining them, will become more apparent and the invention itself will be better understood by reference to the following description of the embodiments of the invention taken in conjunction with the accompanying drawing, wherein.

DETAILED DESCRIPTION OF THE INVENTION

Figure 1:
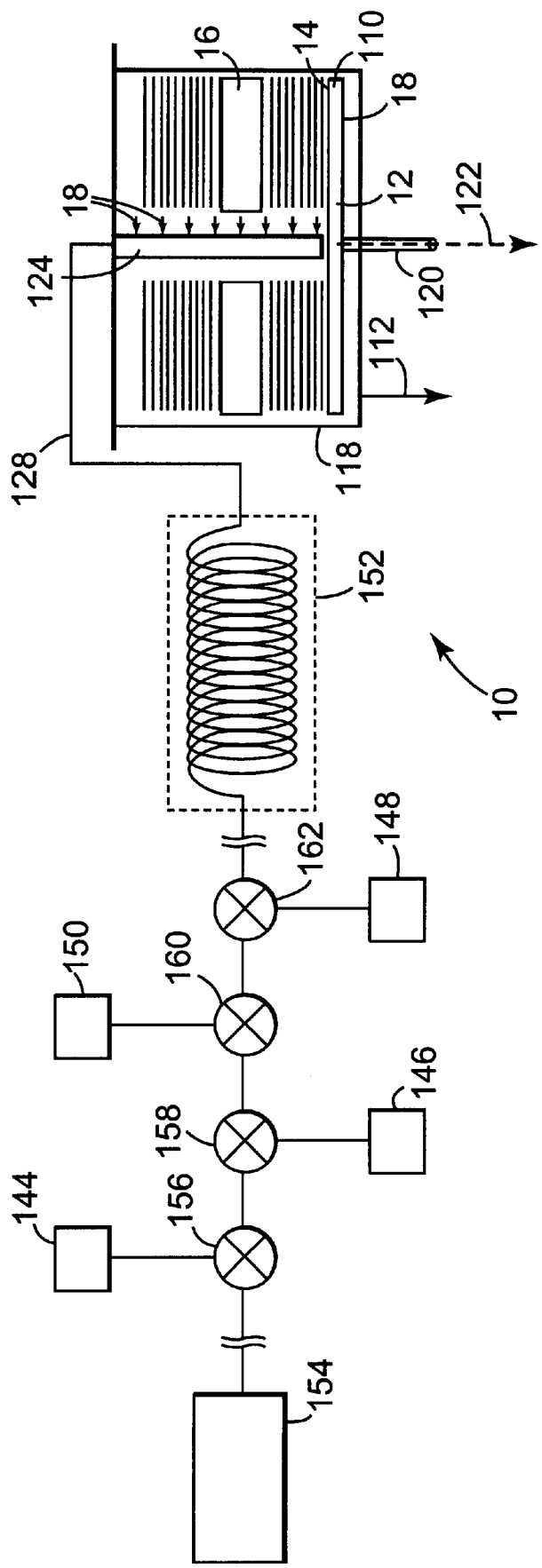
FIG. 1 is a block diagram of one representative system capable of treating a plurality of substrates with an aqueous, acidic etching composition comprising a fluoride ion source and an acidic oxidant in accordance with the present invention, wherein the system may typically comprise one to four wafer cassettes and shows a central spray post for the spray delivery of the etching composition.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The present invention provides compositions and methods for use in selectively stripping tantalum-containing films relative to oxide films. Specifically, the preferred etching compositions of the present invention are aqueous, acidic compositions comprising a relatively large amount of an acidic oxidant and a relatively small amount of a fluoride ion source. The acidic oxidant acts to etch the copper film layer, if any, typically present as an overlying film in such film stacks, and then oxidizes the exposed tantalum-containing film which the fluoride ion source then etches. Advantageously, the etching composition of the present invention is effective to remove any tantalum-containing film. and thus, unlike prior art reclamation processes in which wafers bearing film stacks comprising different tantalum films, the etching composition of the present invention may be applied to wafers comprising any tantalum-containing film, i.e., separation of the wafers based upon the type of tantalum-containing film is not required prior to being subjected to the reclamation method of the present invention.

Additionally, because the fluoride ion source does not appreciably etch tantalum-containing films prior to their oxidation, and further because of the ratio of the acidic oxidant to the fluoride ion source utilized in the etching composition of the present invention, a very high tantalum-containing material/oxide selectivity can be achieved. Due to this high selectivity, the etching composition of the present invention is particularly useful in applications where a tantalum-containing film layer is desirably removed from an underlying oxide film layer, while the substrate below the oxide is desirably left substantially unaffected by the etching process. For example, the etching compositions of the present invention are particularly useful in wafer reclamation processes wherein a film stack comprising a tantalum-containing film and an underlying oxide film are desirably removed from a silicon wafer substrate. In this application, the tantalum-containing, layer would be removed with the etching composition of the present invention, and the remaining oxide layer subsequently removed using a convention chemical useful to remove such an oxide layer.

The acidic oxidant of the aqueous etching composition may be any substance desirably capable etching copper as well as being capable of oxidizing a tantalum-containing film. Preferably, the acidic oxidant utilized in the etching composition has a strong oxidizing capability. For example, suitable acidic oxidants include, but are not limited to, nitric acid, chromic acid, hydroperchloric acid, ammonium peroxodisulfate $((NH_4)_2S_2O_8)$ combinations thereof, and the like. One example of a particularly preferred acidic oxidant for use in the etching composition of the present invention comprises nitric acid.

The fluoride ion source utilized in the etching compositions in accordance with the present invention may be any substance capable of providing a fluoride ion to the etching composition for etching the oxidized tantalum-containing film. Suitable fluoride ion sources include, but are not limited to, hydrofluoric acid, ammonium fluoride, buffered hydrofluoric acid, potassium fluoride, combinations thereof and the like. Preferably, the fluoride ion source utilized in the etching composition of the present invention comprises aqueous hydrofluoric acid.

Many film stacks comprising a tantalum-containing film also comprise an oxide film that is formed on the wafer by subjecting the wafer to high heat, which in turn, causes any exposed silicon surface of the wafer to oxidize, This oxide layer advantageously acts to protect, or passivate, such otherwise exposed surfaces, typically bottom surfaces, of the wafer from the action of any later applied chemicals, such as reclamation chemicals. However, some oxide films, such as TEOS films for example, are formed differently, in a manner that does not result in the substantial oxidation of the bottom surface of the wafer. As a result, the bottom surface of wafers comprising, such films in a film stack may be substantially exposed. Unfortunately, many reclamation chemicals, and in particular those compositions comprising a source of fluoride ions. can etch, or otherwise damage, the exposed silicon surface of a wafer substrate.

In this regard, it has now been surprisingly discovered that the application of an amount of a non-acidic oxidant to wafers with such exposed surfaces, or the inclusion of such a non-acidic oxidant in etching compositions in accordance with the present invention, can reduce, and even eliminate, the damage that might otherwise occur to any exposed surfaces of the wafers. While not wishing to be bound by any theory, it is believed that the inclusion of such a non-acidic oxidant is capable of exerting this effect for at least two reasons. First of all, it is believed that using such a non-acidic oxidant to pre-treat, concurrently treat, or intermittently treat wafers with exposed surfaces can act to provide a passivating oxide layer on such exposed surfaces, thereby protecting them from the action of later-applied chemicals, such as reclamation chemicals. Secondly, any etching of such exposed surfaces by the application of the etching compositions of the present invention would otherwise proceed generally according to the following formula:

$$Si+HNO_3+6HF \rightarrow H_2SiF_6+HNO_2+H_2+H_2O$$

In this reaction, the reduced nitric acid, $HNO_2$, acts as the catalyst that causes the etching of any exposed silicon surfaces. It is believed that the addition of a non-acidic oxidant to this reaction has the effect of oxidizing the reduced nitric acid, which in turn, prevents the reduced nitric acid from exerting this catalytic effect and etching any exposed surfaces.

Thus, in certain embodiments of the present invention, the etching composition further desirably comprises a non-acidic etchant. The inclusion of such a non-acidic etchant provides for the even more widespread usability and applicability of the etching composition of the present invention. That is, etching compositions in accordance with this embodiment of the invention may be utilized to reclaim wafers wherein at least a portion of the wafer substrate is exposed, e.g., wafers bearing TEOS films as an oxide film. The non-acidic oxidant utilized may be any non-acidic oxidant effective to oxidize $HNO_2$, or otherwise oxidize or passivate any exposed surfaces of the wafers being treated with the etching composition of the present invention. Suitable non-acidic oxidants include, for example, but are not limited to, hydrogen peroxide, oxygen or ozone. Preferably, if such a non-acidic oxidant is to be included in the etching composition of the present invention, the non-acidic oxidant comprises hydrogen peroxide.

The etching composition of the present invention may further optionally comprise an amount of water as a solvent. As used herein, the term "water" is meant to include water, distilled water, filtered water, ultrapure deionized water, combinations thereof, and the like.

The etching compositions of the present invention desirably have an acidic pH, i.e., a pH of less than about 7, preferably 5 or less, more preferably 3 or less, and most preferably less than 1. In certain embodiments. an acidic pH may be obtained simply by the choice of acidic oxidant and/or fluoride ion source, and the ratio of these components. For example, both $HNO_3$ and HF are acidic in and of themselves, and thus in those embodiments where they are included in the etching compositions as the acidic oxidant and the fluoride ion source, respectively, an acidic pH of the etching composition will result. If this is not the case, that is, if an acidic pH is not obtained simply by blending the acidic oxidant, the fluoride ion source and water, then the etching composition may desirably comprise an additional hydrogen ion source or other suitable lewis acid capable of lowering the pH to the desired level. Such acids include, but are not limited to, hydrochloric acid, sulfuric acid, acetic acid, phosphoric acid, citric acid, combinations of these, and the like.

The etching composition of the present invention may also include optional ingredients that, for example, enhance the usability and/or performance of the etching composition. For example, the etching composition may optionally include amounts of stabilizers, surfactants, buffering agents, or combinations thereof. If included, such optional ingredients are desirably included in an amount that produces the desired effect, as may readily be ascertained by one of ordinary skill in the art.

Particular formulations of an etching composition in accordance with the present invention can be determined with a view toward desired reclamation parameters, i.e., etch rate and tantalum-containing material/oxide stripping selectivity. In general, enough of the acidic oxidant should be included so that the etching of copper, if present, and the subsequent oxidation of the tantalum-containing film proceeds at a rate such that a reasonable etch rate is achieved. Additionally. enough of the fluoride ion source should be included to remove the oxidized tantalum-containing material at a reasonable rate so that the acidic oxidant may continue to oxidize the tantalum-containing film. Furthermore, the ratio of the amount of acidic oxidant to the amount of fluoride ion source is desirably such that the tantalum-containing material/oxide stripping selectivity is at least about 2 or more, preferably 5 or more, more preferably 10 or more, most preferably about 50 or more.

Of course, relative amounts of the acidic oxidant to the fluoride ion source that will achieve these objectives will depend on the particular combination of acidic oxidant and fluoride ion source chosen. Additionally, the particular acidic oxidant and fluoride ion source will also determine the amount of water that will desirably be added to produce an etching composition in accordance with the present invention. For example, in an etching composition wherein the acidic oxidant is concentrated, e.g., aqueous concentrated nitric acid at 70% solids, and the fluoride ion source is concentrated, e.g., aqueous hydrofluoric acid at 50% solids, the acidic oxidant and fluoride ion source may simply be mixed together in a ratio that results in the desired tantalum-containing material/oxide stripping selectivity, i.e., at least about 2 or more, preferably about 5 or more, more preferably about 10 or more, most preferably about 50 or more. That is, inasmuch as these acids are provided as compositions that include an amount of water, water need not be added to the etching composition as a separate component. The use of concentrated, aqueous acids is further preferred as the use of more concentrated solutions will provide an etching composition with a faster etch rate. Of course, if it is desired to reduce the etch rate, more dilute chemicals could be used.

Bearing these considerations in mind, in preferred etching compositions wherein the acidic oxidant comprises concentrated, aqueous nitric acid (70% solids) and the fluoride ion source comprises concentrated, aqueous hydrofluoric acid (49% solids), it is preferred that the etching composition comprise a ratio of acidic oxidant to fluoride ion source of from about 200:1 to about 20:1, more preferably a ratio of about 100:1. Thus, in terms of weight percentages, it is preferred that the etching compositions of the present invention comprise less than 3% of the aqueous, concentrated hydrofluoric acid and at least 50% of the aqueous, concentrated nitric acid, with the remainder of the etching composition comprising water. More preferably, the etching composition comprises from about 0.01% to about 3% of the concentrated. aqueous hydrofluoric acid and from about 50% to about 99.9% of the concentrated. aqueous nitric acid, with the remainder of the etching, composition comprising water. Most preferably. the etching composition comprises from about 0.1% to about 1% aqueous, concentrated hydrofluoric acid and from about 60% to about 75% aqueous, concentrated nitric acid, with the remainder of the etching composition comprising water.

Although compositions comprising 50–60% concentrated aqueous nitric acid. 10% or more aqueous, concentrated hydrofluoric acid and the remainder water have conventionally been used in cleaning and etching applications during the manufacture of integrated circuits, such compositions arc not known to exhibit high strip selectivity between tantalum-containing films and oxide films. In fact, it is believed that such compositions would favor silicon oxide. Thus such compositions have never been effectively utilized, if at all, in reclamation processes, and in particular, reclamation processes intended to be used to reclaim wafers bearing film stacks comprising tantalum-containing films. Applicant has now surprisingly discovered that, by simply increasing the relative amount of nitric acid relative to hydrofluoric acid, a composition with a very favorable tantalum-containing material/oxide strip selectivity can be obtained.

In addition to providing the aforementioned beneficial selectivity, the etching compositions in accordance with the present invention are further advantageous over prior art etching compositions in that they are effective at etching both tantalum and tantalum nitride films. Thus, whereas previously two different reclamation processes had to be utilized to effectively reclaim wafers comprising each type of films, the etching composition of the present invention can be employed in a reclamation process effective to reclaim wafers comprising both types of tantalum-containing films in film stacks. Also significantly advantageous is the fact that the etching composition of the present invention is capable of providing strip rates that are fast enough to be practically feasible in reclamation processes, e.g., from about 80 Å/m for tantalum films, about 250 Å/m for tantalum nitride films and at least about 10,000 Å/m for copper films, without being substantially heated, and in fact, can provide these strip rates at substantially ambient temperature. Moreover, the etching compositions of the present invention are substantially compatible with many materials, such as PVDF, PFA and PTFE, used to manufacture parts used in processing equipment for semiconductor wafer devices, whereas conventional compositions comprising concentrated HF can discolor parts made of these materials.

Finally, in those preferred embodiments where the etching composition further comprises an amount of a non-acidic oxidant, the etching composition finds further utility in reclamation processes for wafers wherein at least a portion of the wafer substrate is exposed, e.g., wafers comprising TEOS as an oxide layer in a film stack and that, as a result, have a bottom surface that is substantially exposed. That is, whereas prior art reclamation compositions could result in substantial etching or other damage of the exposed surface of such wafers, the etching composition of the present invention, in those embodiments wherein the etching composition further comprises an non-acidic oxidant, does not result in substantial damage occurring to the exposed wafer substrate.

As a result of these advantageous properties of the etching composition, the etching composition of the present invention may advantageously be used to reclaim a semiconductor wafer substrate having a film stack thereon comprising a tantalum-containing film provided over an underlying oxide film. More specifically, the methods of the present invention involve contacting the substrate from which a tantalum-containing film is to be removed with the etching composition of the present invention under conditions effective to remove at least a portion, and preferably at least substantially all, of the tantalum-containing film, thereby exposing at least a portion of the oxide film. The exposed oxide film may then be removed from the semiconductor wafer using, any of a variety of conventional chemical compositions known to be capable of etching oxide films. Although the etching composition may be heated, the aforementioned strip rates and selectivity can be achieved without substantially heating the etching composition, and thus, the etching composition is desirably caused to contact the substrate while at substantially ambient temperature.

Many film stacks comprising such tantalum-containing films further comprise a copper layer overlying the tantalum-containing film. Since the etching compositions of the present invention are very effective at removing copper films, i.e., at strip rates of at least about 10,000 Å/m, if such a film is present it may readily and easily be removed by causing the etching composition to contact the copper film under conditions effective to remove at least a portion, and preferably substantially all, of the copper film, thereby exposing the tantalum-containing film. The thus exposed tantalum-containing film, and the remainder of the film stack, can then be removed by performing the remaining steps of the method described above.

As mentioned hereinabove, it has now been surprisingly discovered that even wafers having at least a portion of the wafer substrate exposed, such as wafers bearing film stacks comprising TEOS as an oxide layer, can be successfully reclaimed using the etching compositions of the present invention by pretreating, concurrently treating, or intermittently treating such wafers with a non-acidic oxidant. Such a non-acidic oxidant can be applied to the substrate concurrently with the etching compositions of the present invention, i.e., as a separate solution, or can be applied to the substrate concurrently in combination with the etching composition, as in those preferred embodiments wherein the etching composition comprises an amount of the non-acidic oxidant. Alternatively, the non-acidic oxidant may be applied to the substrate desirably reclaimed prior to the application of the present inventive etching compositions, or may also be applied to the substrate intermittently with the etching composition. Although any of these approaches can be effective alone at reclaiming wafers with at least a portion of an exposed substrate surface without damaging the exposed substrate surface, in preferred embodiments, these approaches are used in combination, i.e., the wafers are pretreated with an amount of a non-acidic oxidant and then also treated intermittently with the non-acidic oxidant and the etching composition; the wafers are both intermittently and concurrently treated with the non-acidic oxidant and the etching composition, or that the wafers are pretreated with the non-acidic oxidant and then also concurrently treated with non-acidic oxidant and the etching composition. Preferably, the combination utilized comprises pretreating the wafers with the non-acidic oxidant.

The etching composition and a non-acidic oxidant in accordance with the method of the present invention may be applied to the wafer(s) to be reclaimed in one or more immersive and/or non-immersive manners. For example, the wafer(s) may be immersed into the etching composition and/or non-acidic oxidant, i.e., as in a wet bench or a cascade type system of the type commercially available under the trade designation Omega 1000™, 2000™, or 4000™ from YieldUP International, Inc., Mountain View, Calif. Alternatively, the etching composition and/or non-acidic oxidant may be caused to flowably contact the surface of the wafer(s) by, e.g., by dispensing the etching composition in a fluid stream from a source operably placed so that the etching composition and/or non-acidic oxidant contacts the wafer(s). As another option, the etching composition and/or non-acidic oxidant may be sprayed onto the wafer(s) to be reclaimed using an appropriate spraying apparatus.

One particularly preferred type of apparatus that may be used to spray wafer(s) with the etching composition in accordance with the present invention is the centrifugal spray processor commercially available from FSI International, Chaska, Minn., under one or more of the trade designations MERCURY®, SATURN®, TITAN®, or ZETA®. Such spray systems are particularly advantageous in that they are closed systems, thus further enhancing the safety of the method of the present invention. One example of such a centrifugal spray processing system schematically representative of the MERCURY® spray processor is illustrated in FIG. 1.

FIG. 1 shows a system 10 adapted to strip at least a portion of a surface of one or more substrates 16 with an etching composition comprising an acidic oxidant and a fluoride ion source, and/or to treat at least a portion of a surface of one or more substrates with a nonacidic oxidant. Generally, system 10 comprises chamber 118, fluid supply line 128, rotatable support 12, central spray post 124 and exhaust and drain line 112. Chamber 118 is capable of housing one or more semiconductor wafer substrates 16 that are to be treated upon contact with etching composition 18.

Fluid supply line 128 serves to supply etching composition from etching composition supply 144 into chamber 118 by actuating manifold 156. Fluid supply line 128 may optionally include pump (not shown) to aid in motivating etching composition from etching composition supply 144 to chamber 18. As an alternative to providing the inventive etching composition in a pre-mixed format, the etching composition may be provided as separate components and mixed in-process. In this embodiment of the invention, fluid supply line 128 would supply fluoride ion source from fluoride ion source supply 146 by activating manifold 158. Fluoride ion supply would be mixed with acidic oxidant from acidic oxidant supply 148 by activating manifold 162, in which said mixing would occur. Fluid supply line 128 would then supply the mixed etching composition from manifold 162 to chamber 118.

Fluid supply line 128 also may serve to provide a rinse fluid, such as heated distilled water from water heater 154, to chamber 118. Fluid supply line 128 terminates at, and is operationally coupled to, central spray post 124 such that the etching composition 18 is dispensed into chamber 118 through central spray post 124. Optionally, fluid supply line 128 may be bifurcated into a center spray post fluid supply line (not shown) and a side bowl fluid supply line (not shown), which in turn terminate and are operationally coupled to central spray post 124 and side bowl spray post (not shown) so that etching composition may be delivered from either or both the center or side of chamber 118.

Fluid supply line 128 may further optionally serve to supply non-acidic oxidant from non-acidic oxidant supply 150 into chamber 118 by activating manifold 160. By activating manifold 160 alone, i.e., when no other manifold is activated, fluid supply line 128 serves to supply non-acidic oxidant to chamber 118, i.e., so that the non-acidic oxidant can be used to pre-treat or intermittently treat the substrates, Alternatively, etching composition manifold 156 may be activated so that the non-acidic oxidant is pre-mixed with the etching composition to allow for the application of an etching composition in accordance with the present invention further comprising a non-acidic oxidant. Alternatively, the etching composition manifold 156 and non-acidic oxidant manifold 160 may be activated and deactivated in series, thereby providing for the intermittent delivery of etching composition and non-acidic oxidant into chamber 118. Also as an alternative. fluoride ion source manifold 158, acidic oxidant manifold 162 and non-acidic oxidant manifold 160 may be concurrently activated so that an etching composition in accordance with the present invention is prepared on-line and delivered to chamber 118 via fluid supply line 128.

Generally, central spray post 124 includes at least one complementary set, and preferably a plurality of complementary sets, of passages through which streams of etching composition and/or non-acidic oxidant supplied to central spray post 124 can be ejected in such a manner that at least one ejected stream of etching composition and/or non-acidic oxidant impacts another ejected fluid stream which may be a gas (such as nitrogen) or a liquid such as a complementary ejected stream of etching composition. The etching composition and/or non-acidic oxidant is atomized into a mist of droplets 18 as a result.

Rotatable support 12 includes a top surface 14, a bottom surface 18, and a sidewall 110. The surface 14 of rotatable support 12 supports one or more substrate cassettes 116 that hold a plurality of semiconductor wafer substrates 16 above rotatable support 12. Rotatable support 12 is itself supported on motor-driven shaft 120, which is capable of causing rotatable support 12 to rotate about an axis 122 central to motor-driven shaft 120.

During substrate stripping, a desired flow rate of etching composition and/or non-acidic oxidant is dispensed from central spray post 124 in the form of atomized droplets of etching composition 18 and/or non-acidic oxidant. Although the particular overall flow rate achievable from the central spray post 124 will depend on the viscosity of the etching composition and/or non-acidic oxidant utilized in the system of the present invention, the flow rate of etching composition delivered from central spray post 124 will preferably be from about 1000 cc per minute to about 5000 cc per minute. The flow rate of non-acidic oxidant delivered from central spray post 124 will preferably be from about 30 cc/min to about 100 cc/min.

During the delivery of the etching composition, rotatable support 12 can be caused to rotate to more evenly deposit the etching composition and/or non-acidic oxidant on the substrates 16. If rotatable support 12 is desirably rotated, it is preferred that the rate of rotation be from about 20 rpm to about 500 rpm, more preferably from about 50 rpm to about 400 rpm, most preferably from about 100 rpm to about 300 rpm.

Although the etching composition in accordance with the present invention exhibits the aforementioned desirable strip selectivity and strip rate at substantially ambient temperature, it may be desirable to heat the etching composition in some applications. Thus, fluid supply line 128 may further optionally include on-line heater 152 operationally located so as to be capable of heating the etching composition, and temperature probe (not shown) so that such heating is capable of being monitored.

Exhaust and drain lines 112 are provided so that etching composition and/or non-acidic oxidant (and/or a purging gas, if employed) may be vented from chamber 118. Additionally, fluid supply line 128 and/or exhaust and drain lines 112 may optionally comprise a flow regulating device (not shown) to regulate the flow of etching composition, non-acidic oxidant and exhaust, respectively.

In operation, system 10 could be used to reclaim a semiconductor wafer bearing a film stack comprising a tantalum-containing film overlying an oxide film, such as TOX, as follows. One or more semiconductor wafer substrates 16 bearing such a film stack would be supportably placed in substrate cassette(s) 116. Rotatable support 12 would be caused to rotate at 200 rpm, while the etching composition in accordance with the present invention is caused to spray out of central spray post 124 at a flow rate at the substrate surface of about 1700 cc per minute. During this dispensation, rotatable support 12 is maintained at a rotation rate of 200 rpm. Dispensation of etching composition is ceased once the tantalum-containing film has been removed, at which time a standard rinse sequence is initiated. The dispense time is dependent upon the thickness of the film to be removed, and is typically from about 3 to about 5 minutes.

Advantageously, the etching compositions may further optionally comprise an amount of a non-acidic oxidant, or a non-acidic oxidant may be applied separately to the substrate desirably reclaimed, so as to be useful in reclamation processes for wafers having at least a portion of the wafer substrate exposed. System 10 could also be used to reclaim such a semiconductor wafer, e.g., a wafer bearing a film stack comprising a tantalum-containing film overlying a TEOS film as follows. One or more semiconductor wafer substrates 16 bearing such a film stack would be supportably placed in substrate cassette(s) 116. Rotatable support 12 would be caused to rotate at 200 rpm, while the wafers are pretreated with a non-acidic oxidant, by activating non-acidic oxidant manifold 160 so that fluid supply line 128 delivers non-acidic oxidant to central spray post 124. Specifically, a 20:1 $H_2O/H_2O_2$ ($H_2O_2$, 30% w/v) mixture is dispensed onto the surface of the wafers at approximately 2100 cc/m for an amount of time sufficient to oxidize or passivate, the at least a portion of the exposed surface of the wafer, e.g., at least about 60 seconds. An etching composition in accordance with the present invention, comprising an amount of the non-acidic oxidant peroxide is prepared in-process by the activation of both etching composition manifold 156 to provide a flow rate of etching composition of 1700 cc/min and non-acidic oxidant manifold 160 to provide a flow rate of peroxide of 100 cc/min through fluid supply line 128 to provide an etching composition in accordance with the present invention. This etching composition is caused to spray out of central spray post 124 at a flow rate at the wafer surface of about 1800 cc per minute. During this dispensation, rotatable support 12 is maintained at a rotation rate of 200 rpm. Dispensation of etching composition is ceased once the tantalum-containing film has been removed, at which time a standard rinse sequence is initiated. The dispense time is dependent upon the thickness of the film to be removed, and is typically from about 3 to about 5 minutes.

Figure 2:
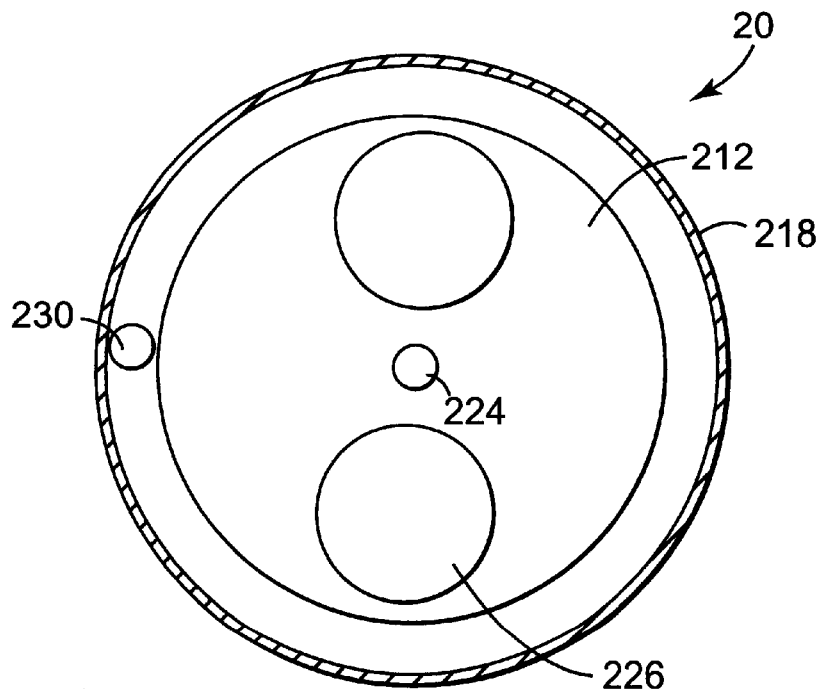
FIG. 2 is a top cross-sectional schematic view of a preferred embodiment of the system shown in FIG. 1, wherein the cross-section is taken along line A—A, and wherein the system comprises two wafer cassettes and shows both a central spray post and a side bowl spray post for the spray delivery of an etching composition in accordance with the present invention.

An alternative embodiment of system 10 is illustrated in FIG. 2. The embodiment of system 20 shown in FIG. 2 is generally identical to system 10 illustrated in FIG. 1, with the exception that system 20 illustrates both central spray post 224 and peripheral spray post 230. Etching composition and/or non-acidic oxidant may be delivered from either one or both of central spray post 224 and/or peripheral spray post 230. If etching composition is to be delivered from both central spray post 224 and peripheral spray post 230, it is preferred that the volume ratio of etching composition delivered from central spray post 224 to etching composition delivered from peripheral spray post 230 be from about 7:3 to about 5:5.

Figure 3:
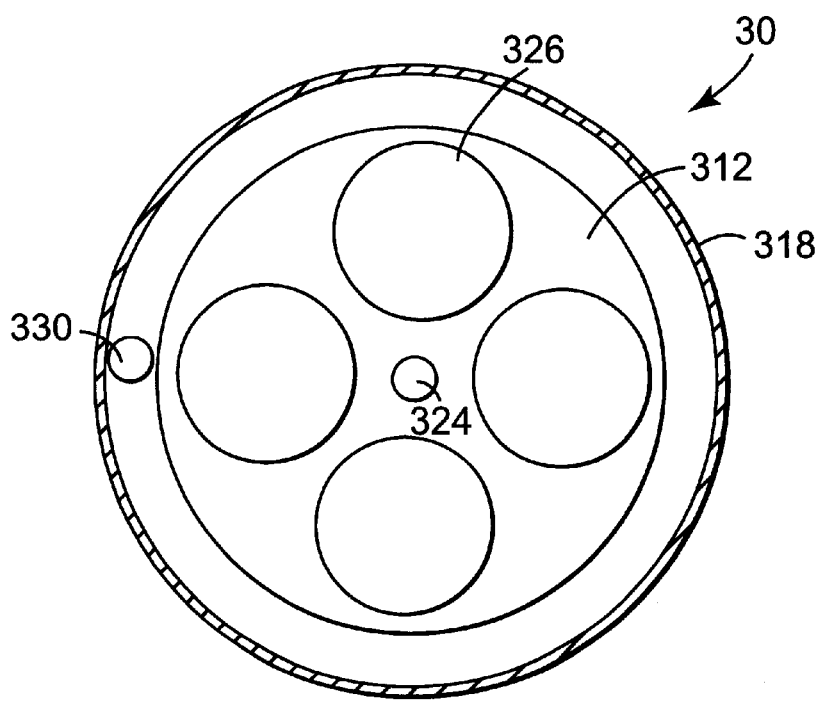
FIG. 3 is a top cross-sectional schematic view of a preferred embodiment of the system shown in FIG. 1, wherein the cross-section is taken along line A—A, and wherein the system comprises flour wafer cassettes and shows both a central spray post and a side bowl spray post for the spray delivery of an etching composition in accordance with the present invention.

An additional preferred embodiment of system 10 is shown in FIG. 3 to further illustrate the manner in which the number and placement of substrate cassettes may be varied in the practice of the method of the present invention. In particular, the embodiment of system 30 shown in FIG. 3 is generally identical to system illustrate in FIG. 1, with the exception that four substrate cassettes are arranged at substantially regular intervals around the periphery of rotating support 312.

The present invention will be described below with reference to the following representative examples.

EXAMPLE 1

The following experiment was conducted to demonstrate the tantalum-containing material/oxide stripping selectivity of an etching composition in accordance with the present invention. Specifically 10 liters of an etching composition in accordance with present invention was prepared by combining 9.9 liters of nitric acid (69.3–70 weight % solids) and 99 cc of hydrofluoric acid (48.5–49.2 weight % solids) to provide an etching composition with 99 volume percent of nitric acid and 0.99 volume percent hydrofluoric acid and 69.3 weight percent nitric acid, 0.49 weight percent hydrofluoric acid, and 30 weight percent water. The resulting etching composition was added to the etching composition supply of a MERCURY® centrifugal spray processor. Alternatively, the etching composition can be prepared with the MERCURY® online blending system using 1700 cc/m of nitric acid (69.3–70 weight % solids) blended with 17 cc/m of hydrofluoric acid (48.5–49.2 weight % solids) in a manifold of the MERCURY® spray processor.

One silicon wafer having a tantalum nitride (TaN) film overlying a thermal silicon oxide ($SiO_2$) film was placed in one substrate cassette and one silicon wafer having only a thermal oxide film TOX was placed into a second substrate cassette in an opposing position on the rotatable support from the first substrate cassette. Another silicon wafer with a tantalum (Ta) film overlying a thermal silicon oxide ($SiO_2$) film was placed in the same substrate cassette as the wafer bearing the TaN film. The film thickness on the wafers was measured both before and after etching at nine (9) different points.

The rotatable support was initially caused to rotate at 200 rpm prior to dispensing any etching composition. Once the rotatable support attained 200 rpm, etching composition was dispensed through the center spray post onto the surface of the wafers at 1700 milliliters per minute, while maintaining the rotatable support at a speed of 200 rpm. Etching composition was dispensed for a total of 3 minutes, after which time, dispensation of the etching composition was ceased and a standard rinse sequence was initiated.

The water comprising the TaN film lost an average of 720 Å in film thickness, i.e., the etching composition of the present invention etched the TaN film at rate of 240 Å/m. The wafer comprising the Ta film lost an average of 270 Å in film thickness, i.e., the etching composition of the present invention etched the Ta film at rate of 90 Å/m. On the other hand, the wafer comprising only the oxide film lost an average of only 90 Å in film thickness, i.e., the etching composition of the present invention etched the oxide film at a rate of 30 Å/m. Thus, the TaN/$SiO_2$ stripping selectivity exhibited by the etching composition was 240/30 or about 8:1 and the Ta/$SiO_2$ stripping selectivity exhibited by the etching composition was 90/30 or 3:1.

EXAMPLE 2

The following comparative experiment was conducted to demonstrate the effect of the application of the etching composition, without the addition of a non-acidic oxidant or pre-treatment with a non-acidic oxidant, on silicon wafers bearing a film stack comprising a tantalum or tantalum nitride film overlying a TEOS film, i.e., wafers with a substantially exposed bottom surface. Specifically, 10 liters of an etching composition in accordance with present invention were prepared as in Example 1 and added to the etching composition supply of a MERCURY® centrifugal spray processor. One silicon wafer having a TaN film overlying a TEOS film was placed in one substrate cassette and one silicon wafer having Ta film overlying a TEOS film was placed into a second substrate cassette in an opposing position on the rotatable support from the first substrate cassette. The film thickness on the wafers was measured both before and after etching at nine (9) different points.

The rotatable support was initially caused to rotate at 200 rpm prior to dispensing any etching composition. Once the rotatable support attained 200 rpm, etching composition was dispensed through the center spray post onto the surface of the wafers at 1700 cc per minute, while maintaining the rotatable support at a speed of 200 rpm. Etching composition was dispensed for a total of 3 minutes, after which time, dispensation of the etching composition was ceased and a standard rinse sequence was initiated.

Both wafers comprising the Ta and TaN film lost an average of 240 Å and 720 Å in film thickness, respectively. However, an amount of a non-acidic oxidant was not used to pre-treat the wafers or included in the etching composition, and thus, the bottom of the wafers were not coated with oxide. As a result, the bottom surface of the wafers was damaged or etched, by application of the etching composition not comprising a non-acidic oxidant.

EXAMPLE 3

The following experiment was conducted to demonstrate the effect of the application of the etching composition on silicon wafers bearing a film stack comprising a tantalum or tantalum nitride film overlying a TEOS film, i.e., wafers with a substantially exposed bottom surface when the wafers are pretreated with an amount of a non-acidic oxidant and additionally, the etching composition comprises an amount of a non-acidic oxidant, i.e., peroxide. Specifically, 10 liters of an etching composition in accordance with present invention were prepared as in Example 1 and added to the etching composition supply of a MERCURY® centrifugal spray processor. One silicon wafer having a TaN film overlying a TEOS film was placed in one substrate cassette and one silicon wafer having Ta film overlying a TEOS film was placed into a second substrate cassette in an opposing position on the rotatable support from the first substrate cassette. The film thickness on the wafers was measure both before and after etching at nine (9) different points.

The rotatable support was initially caused to rotate at 200 rpm prior to dispensing any chemicals. Once the rotatable support attained 200 rpm, a non-acidic oxidant, specifically a 20:1 $H_2O/H_2O_2$ ($H_2O_2$, 30% w/v) mixture, was dispensed onto the surface of the wafers at approximately 2100 cc/m for 60 seconds in order to oxidize, or passivate, the backside of the wafer. Then, the prepared etching composition was blended with the non-acidic oxidant, peroxide, by contacting the etching composition, at a flow rate of approximately 1700 cc per minute, with peroxide, at a flow rate of approximately 100 cc per minute, in a manifold of the MERCURY® centrifugal spray processor. The resulting etching composition was immediately dispensed through the center spray post onto the surface of the wafers at approximately 1800 cc/m, while maintaining the rotatable support at a speed of 200 rpm. Etching composition was dispensed for a total of 3 minutes, after which time, dispensation of the etching composition was ceased and a standard rinse sequence was initiated.

Both wafers comprising the Ta and TaN film lost an average of 240 Å and 720 Å in film thickness, respectively. Additionally, and in contrast to Example 2 where the wafers were neither pretreated with a non-acidic oxidant nor did the etching composition include such a non-acidic oxidant, the bottom surface of the wafers was not substantially damaged.

EXAMPLE 4

The following experiment was conducted to demonstrate the effect of the application of the etching composition on wafers bearing a film stack comprising a tantalum or tantalum nitride film overlying a TEOS film, i.e., wafers with a substantially exposed bottom surface when the wafers are pretreated with an amount of a non-acidic oxidant, and furthermore, a non-acidic oxidant was dispensed intermittently with an etching composition in accordance with the present invention. Specifically, 10 liters of an etching composition in accordance with present invention were prepared as in Example 1 and added to the etching composition supply of a MERCURY® centrifugal spray processor. One silicon wafer having a TaN film overlying a TEOS film was placed in one substrate cassette and one silicon wafer having Ta film overlying a TEOS film was placed into a second substrate cassette in an opposing position on the rotatable support from the first substrate cassette. The film thickness on the wafers was measure both before and after etching at nine (9) different points.

The rotatable support was initially caused to rotate at 200 rpm prior to dispensing any chemicals. Once the rotatable support attained 200 rpm. a non-acidic oxidant, specifically a 20:1 $H_2O/H_2O_2$ ($H_2O_2$, 30% w/v) mixture, was dispensed onto the surface of the wafers at approximately 2100 cc/m for 60 seconds in order to oxidize, or passivate, the bottom of the wafers. Then, the prepared etching composition was dispensed onto the surface of the wafers at 1700 cc per minute for 30 seconds followed by dispensation of the 20:1 $H_2O/H_2O_2$ mixture at 2100 cc/m for 30 seconds. These two 30 second dispensation steps were repeated 6 times, after which time, dispensation of the etching composition and $H_2O/H_2O_2$ was ceased and a standard rinse sequence was initiated.

Both wafers comprising the Ta and TaN film lost an average of 240 Å and 720 Å in film thickness, respectively. Additionally, and in contrast to Example 2 where the wafers were neither pretreated with a non-acidic oxidant nor was such a non-acidic oxidant intermittently dispensed with the etching composition, the bottom surface of the wafers was not substantially damaged.

EXAMPLE 5

The following experiment was conducted to demonstrate that the tantalum nitride or tantalum/oxide stripping selectivity of an etching composition in accordance with the present invention allows a Ta or TaN film to be effectively stripped from an underlying oxide film, while leaving the oxide film substantially unetched, i.e., the oxide film acts as a "stop layer". Additionally, this example was conducted to show that, by pre-treating the wafers with a non-acidic oxidant and further by including such a non-acidic oxidant in the etching composition of the present invention, substantial damage to any exposed surface of the wafers can be avoided.

Specifically, 10 liters of an etching composition in accordance with present invention were prepared as in Example 1 and added to the etching composition supply of a MERCURY® centrifugal spray processor. One group of ten (10) silicon wafers bearing a film stack comprising a Ta film overlying a TEOS film was placed into a substrate cassette, while another group of ten (10) silicon wafers bearing a film stack comprising a TaN film overlying a TEOS film was placed into a separate substrate cassette placed in an opposing position on the rotatable support from the first substrate cassette. The thickness of the Ta film on each wafer was about 400 Å, whereas the thickness of the TEOS film underlying Ta film was about 4000 Å. The thickness of the TaN film on each wafer was about 350 Å, whereas the thickness of the TEOS film underlying TaN film was about 2000 Å.

The rotatable support was initially caused to rotate at 200 rpm prior to dispensing any chemicals. Once the rotatable support attained 200 rpm, a non-acidic oxidant, specifically a 20:1 $H_2O/H_2O_2$ ($H_2O_2$, 30% w/v) mixture, was dispensed onto the surface of the wafers at approximately 2100 cc/m for 60 seconds in order to oxidize, or passivate, the backside of the wafers. Then, the prepared etching composition was blended with the non-acidic oxidant peroxide by contacting the etching composition, at a flow rate of approximately 1700 cc per minute., with peroxide, at a flow rate of approximately 100 cc per minute, in a manifold of the MERCURY® centrifugal spray processor. The resulting etching, composition was immediately dispensed through the center spray post onto the surface of the wafers at approximately 1800 cc/m, while maintaining the rotatable support at a speed of 200 rpm. Etching composition was dispensed for a total of 5 minutes, after which time, dispensation of the etching composition was ceased and a standard rinse sequence was initiated.

It was found that the etching composition effectively removed the Ta and TaN layer from each of the wafers, and further that, on average, only 200 Å of the TEOS layer was removed, i.e., about 90% to 95% of the oxide layer remained on the surface of the wafer. Additionally, the bottom surface of the wafers was not substantially damaged by the reclamation process. The remaining oxide film layer was subsequently effectively stripped off using conventional hydrofluoric acid chemistry to finish the wafer reclamation process. Thus, this experiment shows that, when utilizing an etching composition according to the present invention, an oxide film underlying a Ta or TaN film can effectively act as a "stop layer", thereby protecting the underlying wafer from damage during the wafer reclamation process. Additionally, no substantial damage to the bottom of the wafer occurred as a result of exposing the wafers to this reclamation process, due in substantial part to the pretreatment of the wafers with a non-acidic oxidant and also by virtue of the inclusion of a non-acidic oxidant in the etching compositions of the present invention.

EXAMPLE 6

The following experiment was conducted to demonstrate that silicon wafers bearing film stacks comprising a copper film overlying a tantalum nitride film overlying a TEOS film (Cu/TaN/TEOS) can be stripped down to the TEOS film using an etching composition in accordance with the present invention, while leaving the TEOS film substantially unetched, i.e., the oxide film acts as a "stop layer". Additionally, this example was conducted to show that, by pre-treating the wafers with a non-acidic oxidant and further by including such a non-acidic oxidant in the etching composition of the present invention, substantial damage to any exposed surface of the wafers can be avoided.

Specifically, 10 liters of an etching composition in accordance with present invention were prepared as in Example 1 and added to the etching composition supply of a MER-CURY® centrifugal spray processor. Two groups of ten (10) silicon wafers bearing a film stack comprising a TaN film overlying a TEOS film were placed into two substrate cassettes, which were in turn, placed in opposing positions on the rotatable support. The thickness of the Cu film on the wafer was about 8500 Å. the thickness of the TaN film was about 350 Å, and the thickness of the TEOS film was about 2000 Å.

The rotatable support was initially caused to rotate at 200 rpm prior to dispensing any chemicals. Once the rotatable support attained 200 rpm, a non-acidic oxidant, specifically a 20:1 $H_2O/H_2O_2$ ($H_2O_2$, 30% w/v) mixture, was dispensed onto the surface of the wafers at approximately 2100 cc/m for 60 seconds in order to oxidize, or passivate, the backside of the wafers. Then, the prepared etching composition was blended with the non-acidic oxidant peroxide by contacting the etching composition, at a flow rate of approximately 1700 cc per minute, with peroxide, at a flow rate of approximately 100 cc per minute, in a manifold of the MERCURY® centrifugal spray processor. The resulting etching composition was immediately dispensed through the center spray post onto the surface of the wafers at approximately 1800 cc/m, while maintaining the rotatable support at a speed of 200 rpm. Etching composition was dispensed for a total of 5 minutes, after which time, dispensation of the etching composition was ceased and a standard rinse sequence was initiated.

It was found that the etching composition effectively removed the Cu and TaN film layers from the wafers, and further that, on average, only 200 Å of the TEOS layer was removed, i.e., about 90% the oxide layer remained on the surface of the wafer. Additionally, the bottom surface of the wafers was not substantially damaged by the reclamation process. The remaining oxide film layer was subsequently effectively stripped off using conventional hydrofluoric acid chemistry to finish the wafer reclamation process. Thus, this example shows that, etching compositions in accordance with the present invention can be utilized to effectively remove Cu/TaN/TEOS film stacks. This example further illustrates that, when utilizing an etching composition according to the present invention, an oxide film underlying a TaN film can effectively act as a "stop layer", thereby protecting the underlying wafer from damage during the wafer reclamation process. Additionally, no substantial damage to the bottom of the wafer occurred as a result of exposing the wafers to this reclamation process, due in substantial part to the pretreatment of the wafers with a non-acidic oxidant and also by virtue of the inclusion of a non-acidic oxidant in the etching compositions of the present invention.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of selectively etching a semiconductor wafer substrate bearing a film stack comprising a tantalum-containing film overlying an oxide film, said method comprising the steps of:

(a) causing an aqueous etching composition to contact the tantalum-containing film under conditions effective to etch at least a portion of the tantalum-containing film on the semiconductor wafer substrate thereby exposing the oxide film, wherein the etching composition consists essentially of an acidic oxidant, a fluoride ion source, and optionally a non-acidic oxidant, and wherein the weight ratio of the acidic oxidant to the fluoride ion source is sufficiently high such that the etching composition has a tantalum-containing material/oxide stripping selectivity of at least about 2 or more; and (b) removing the exposed oxide film from the semiconductor wafer substrate.

2. The method of claim 1 wherein the etching composition consists essentially of acidic oxidant and fluoride ion source.

3. The method of claim 2 wherein the acidic oxidant comprises concentrated, aqueous nitric acid and the fluoride ion source comprises concentrated, aqueous hydrofluoric acid.

4. The method of claim 3 wherein the etching composition comprises a ratio of acidic oxidant to fluoride ion source of from about 200:1 to about 20:1.

5. The method of claim 3 wherein the etching composition comprises a ratio of acidic oxidant to fluoride ion source of from about 200:1 to about 100:1.

* * * * *